(12) United States Patent
Dietze et al.

(10) Patent No.: US 10,898,932 B2
(45) Date of Patent: Jan. 26, 2021

(54) METHOD AND APPARATUS FOR CLEANING A SUBSTRATE AND COMPUTER PROGRAM PRODUCT

(71) Applicant: SUSS MicroTec Photomask Equipment GmbH & Co. KG, Sternenfels (DE)

(72) Inventors: Uwe Dietze, Austin, TX (US); Habib Hichri, Corona, CA (US); Seongkuk Lee, Corona, CA (US); Davide Dattilo, Bretten (DE); Martin Samayoa, Corona, CA (US)

(73) Assignee: SUSS MICRO TEC PHOTOMASK EQUIPMENT GMBH & CO KG, Sternenfels (DE)

( * ) Notice: Subject to any disclaimer, the term of this patent is extended or adjusted under 35 U.S.C. 154(b) by 199 days.

(21) Appl. No.: 15/893,993

(22) Filed: Feb. 12, 2018

(65) Prior Publication Data
US 2019/0247896 A1    Aug. 15, 2019

(51) Int. Cl.
*B08B 7/00* (2006.01)
*G03F 1/22* (2012.01)
*G03F 1/82* (2012.01)

(52) U.S. Cl.
CPC ............. *B08B 7/0042* (2013.01); *G03F 1/22* (2013.01); *G03F 1/82* (2013.01)

(58) Field of Classification Search
CPC combination set(s) only.
See application file for complete search history.

(56) References Cited

U.S. PATENT DOCUMENTS

| 6,144,010 A * | 11/2000 | Tsunemi | B08B 7/0042 |
| | | | 219/121.68 |
| 2009/0038637 A1* | 2/2009 | LeClaire | G03F 1/82 |
| | | | 134/1 |
| 2012/0219654 A1 | 8/2012 | Kim et al. | |
| 2014/0345646 A1 | 11/2014 | Kwak et al. | |

* cited by examiner

*Primary Examiner* — Duy Vu N Deo
*Assistant Examiner* — Christopher Remavege
(74) *Attorney, Agent, or Firm* — Tarolli, Sundheim, Covell & Tummino LLP

(57) ABSTRACT

A method and an apparatus for cleaning a substrate having at least one surface having a residue to be removed thereon is described. The method comprises: scanning at least an area of the surface having the residue thereon with laser light to thereby heat the surface and the residue; controlling the heating so that a part of the residue first liquefies such that the liquefied part of the residue starts flowing towards the solid part of the residue, thereby forming a meniscus with the solid part of the residue and accumulating in part on top of the solid part, the thus generated thicker layer of residue absorbing further heat to be decomposed or vaporized.

12 Claims, 11 Drawing Sheets

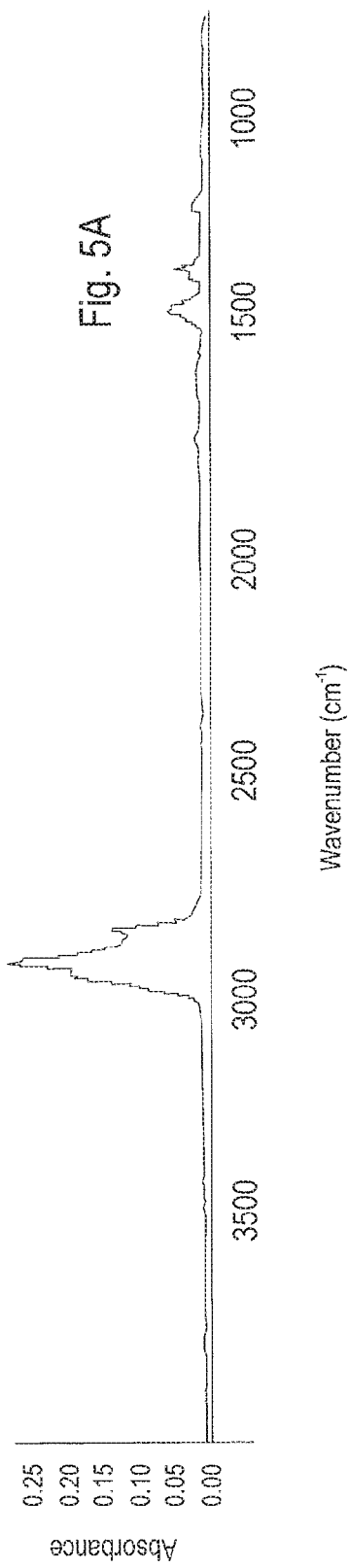

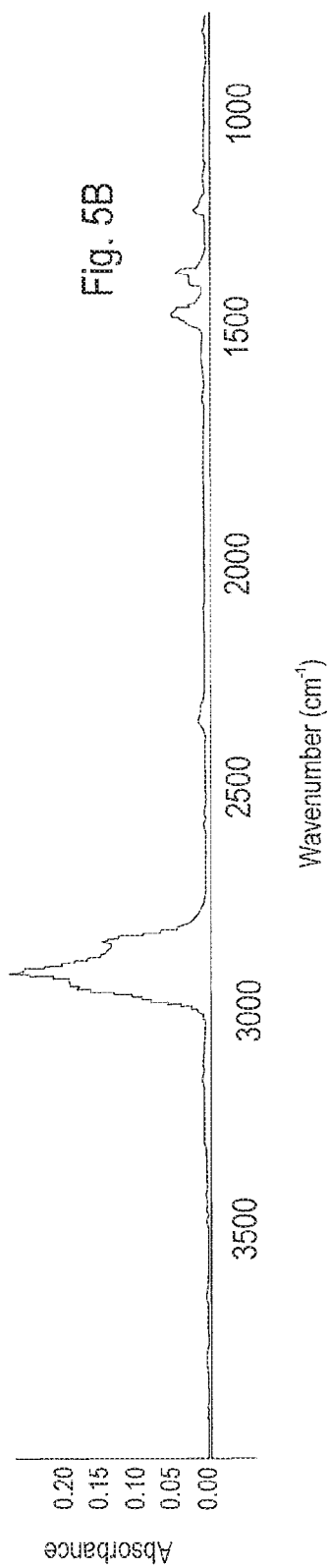

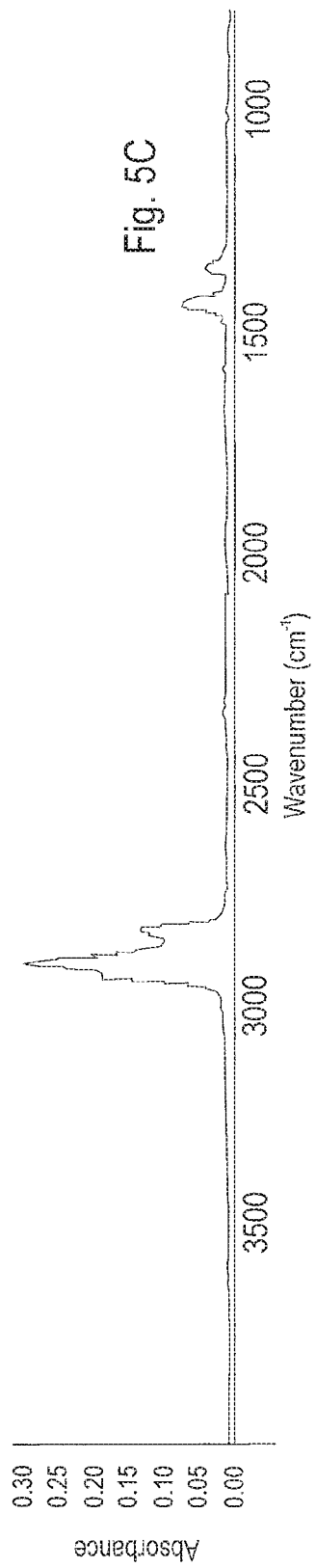

METHOD AND APPARATUS FOR CLEANING A SUBSTRATE AND COMPUTER PROGRAM PRODUCT

TECHNICAL FIELD

The present invention relates to a method for cleaning a substrate. The present invention also relates to an apparatus and a computer program product for cleaning a substrate.

BACKGROUND ART

The present invention relates to an apparatus and a method for cleaning a substrate, in particular an immersion lithography photomask or an extreme-ultraviolet (EUV) photomask.

In many technical fields, and in particular in the semiconductor production field, cleaning of substrates may be challenging due to the required cleanliness of the cleaned substrates. One example of such a substrate, which requires high cleanliness, is a photomask, which is for example used in photolithography for the mass production of integrated circuit devices.

Any particles on the surfaces of such photomasks, in particular the patterned surfaces thereof may lead to errors in the substrates being imaged using the photomask. Therefore, regular cleaning of the photomasks is required, which, however may reduce the lifetime thereof. In order to protect certain surfaces of the photomasks from particle contamination, pellicles have been introduced. Pellicles are thin films or membranes, which are for example attached to a frame that is glued to one side of the photomask, such that the membrane acts as a cover preventing particles from reaching the covered surface. The pellicle is spaced far enough from the mask, so that moderate to small sized particles that may be present on the pellicle will be too far out of focus to influence imaging of the photomask. By using such pellicles, the cleaning cycles for photomasks may be reduced, thereby increasing the lifetime of the photomask and at the same time imaging results were improved.

However, such pellicle membranes have to be exchanged after a certain number of imaging cycles by removal of the pellicle frame, which is glued to the mask surface. After removal of the pellicle frame, some of the glue remains on the photomask, which has to be fully removed before a further pellicle membrane with frame may be attached to the photomask.

In the past, aggressive chemical cleaning solutions had to be used to remove the glue residuals from the surface of the photomask. For example, SPM has been employed over the past years to remove the typically polymeric glue residuals. Despite its good cleaning performances, SPM has created other problems such as haze generation. Further methods have been proposed to overcome the haze issues by for example using different chemistry which avoids haze generation. However, these chemistries often only allowed partial removal of the glue in acceptable time limits and full removal was difficult if at all achieved. For both the SPM and other chemistries, it was also not possible to only clean local areas of the photomask as the chemistry was not contained. Hence the chemistry was also applied to areas which did not need cleaning, thereby increasing the amount of chemistry needed and creating a danger of damaging those areas. Also dry removal methods such as laser ablation have been suggested to remove pellicle glue residuals, but these methods were very specific to a single use and difficult to control.

There are also some other publications which employ a laser for cleaning a substrate such as US 2012/0219654 A and US 2014/0345646 A. US 2012/0219654 A for example discloses a photomask cleaning apparatus which includes a photomask receiving stage and a laser supply unit. The photomask receiving stage receives and retains a photomask in a desired orientation. The photomask has a front face having a pellicle adhesive residue region thereon. The desired orientation is with the front face positioned to allow gravity to move particles on the front face away from the front face without interference from the front face of the photomask. The laser supply unit generates a laser beam that directly irradiates pellicle adhesive residue in a target region on the front face of the photomask to remove the same from the target region by laser ablation. During the ablation process, the laser energy is taken up by the pellicle adhesive residue and causes in substance instantaneous decomposition thereof. The photomask cleaning apparatus is configured to move the laser across the front face of the photomask to irradiate the entire pellicle adhesive residue region. In particular a laser beam which has a wavelength range from about 193 nm to about 355 nm is employed in the ablation process.

US 2014/0345646 A discloses an apparatus and method for cleaning a photomask by heating a metal plate arranged adjacent an adhesive residue on the substrate by means of a laser. This apparatus is for example suitable for removing an adhesive residue from a photomask, and has a holder for disposing a photomask such that a surface thereof on which an adhesive residue is left behind is directed downwards and such that the metal plate is positioned adjacent to the adhesive residue. The apparatus also has a laser generator for irradiating a laser through the photomask and the adhesive residue onto the metal plate to heat the same to a temperature which is sufficient to cause decomposition of the adhesive residue by heat from the metal plate.

There, however, may a problem of not being able to clean the substrate properly in these prior art. For example, when it comes to the traditional approach using SPM-based chemistries, a major drawback is in the risk of inadvertently exposing the active area of a mask to aggressive chemistries, risking CD shift, damaging to sub-resolution assist features (SRAFs), accelerating haze growth, and thus reducing masks lifetime. Direct laser ablation as described in US 2012/0219654 A, may lead to insufficient cleaning as each particle has to be sufficiently exposed to the laser beam to be decomposed. US 2014/0345646 employs the metal plate and utilizes heat generated from the metal plate, and thus the configuration becomes complicated and it is difficult to heat a residue efficiently and precisely on the substrate due to a gap between the metal plate and the residue. Furthermore, the metal plate may be a source of undesired contaminants.

Therefore, starting from the known prior art for cleaning a substrate, it is an object of the present invention to provide a method and an apparatus for cleaning a substrate which may at least partially overcome one or more of the disadvantages of the art some examples of which are given above.

SUMMARY

In accordance with the present invention, a method for cleaning a substrate having at least one surface having a residue to be removed thereon is defined by the appended claims. Further embodiments are inter alia disclosed in the dependent claims.

In particular, according to an aspect of an embodiment, the method includes scanning at least an area of the surface having the residue thereon with laser light to thereby heat the surface and the residue; and controlling the heating so that a part of the residue first liquefies such that the liquefied part of the residue starts flowing towards the solid part of the residue, thereby forming a meniscus with the solid part of the residue and accumulating in part on top of the solid part, the thus generated thicker layer of residue absorbing further heat to be decomposed or vaporized.

In the present invention, the liquefied residue will move towards the not yet liquefied glue residue due to surface tension differentials between the liquefied and the solid portion of the meniscus (Marangoni effect). Hence, the meniscus moves forward at about the same rate as the secondary movement described above, building up and being further heated during the process to get decomposed or vaporized. Hence, the method makes it possible to clean the substrate properly. In particular, the method enables a laser based cleaning process for the substrate, which uses the Marangoni effect to ensure that no material remains on the surface of the substrate. Moreover, for example, since the method does not use SPM based chemistries, the method is able to clean the substrate without taking risk of inadvertently exposing the active area of a mask to aggressive chemistries, which could cause CD shift, damaging to sub-resolution assist features (SRAFs), accelerating haze growth, and thus reducing masks lifetime. Moreover, according to the method as defined, since no additional metal plate is required to heat the residue to be removed, thus the configuration to clean the substrate can be relatively simple. Moreover, comparing the method using the additional metal plate, the method enables to heat the remaining residue efficiently and precisely. As a result, the method makes it possible to heat the remaining residue efficiently and precisely, and thus to effectively clean the substrate.

Furthermore, according to an aspect of an embodiment, the heating is controlled at least in part by at least one of the following: a scanning speed, a laser spot size of the laser light on the substrate, pulse frequency of the laser light, laser focus level, and energy of the laser light. Hence, the heating may be controlled in an easy and well defined manner during the scanning to clean the substrate efficiently.

According to another aspect of an embodiment, the scanning of the laser light includes moving the laser light back and forth in a first direction repeatedly with a first scanning speed, while moving the laser light in a second direction which is perpendicular to the first direction with a second scanning speed. Hence, the method can remove the remaining residue from the substrate efficiently and in a well-defined manner while moving the liquefied residue in a defined direction.

Furthermore, according to an aspect of an embodiment, the first scanning speed is fast enough to form the meniscus at a scanned area of the surface, and faster than the second scanning speed, and the second speed is slow enough for the meniscus to move forward in the second direction. Hence, the method can efficiently remove the remaining residue while avoiding overheating the substrate.

In accordance with another aspect of an embodiment, the surface of the substrate which has the residue thereon has a central region, and the residue is in a region of the surface radially outside the central region, and the second direction is in a direction from a radially inner side of the residue to the radially outer side of the residue such that the meniscus moves away from the central region. Hence, the method can remove the remaining residue from the substrate efficiently, especially from around the central region. Moreover, any movement of liquefied residue is away from the central region to the edge of the substrate, therefore preventing any contamination of the central region.

The central region may have a rectangular shape, and the residue may have a line shape approximately parallel to one side of the central region, wherein the first direction may be in a longitudinal direction of the residue, and the second direction in a width direction of the residue. This allows removing the remaining residue from the substrate efficiently and in an organized manner.

In another embodiment, the central region may have a rectangular shape, and the residue may be located outside the central region, wherein the second direction is directed away from the central region towards an edge of the substrate, thus making sure that any liquefied residue is moved away from the central region.

The scanning of the laser light may include moving forward in a second direction with a second scanning speed which is slow enough to for the meniscus which is formed in a scanned area of the surface to move forward in the second direction. Thus may ensure that all residue is efficiently removed from the substrate.

A laser having a wavelength between 5 and 25 µm has been found beneficial for many applications in particular glue removal applications. In an embodiment, the laser light is a $CO_2$ laser with wavelength of approximately 10.6 µm, and the substrate is any one of a bare quartz substrate, a metal-coated substrate, and a mix of metal and quartz substrate. This combination of laser and material for the substrate is specifically beneficial in lithographic mask applications for efficiently removing residue from the substrate.

In order to prevent overheating of the substrate at the end of each scan the energy of the laser light may be reduced towards the ends of each scan pass in the first direction. This effect is especially beneficial when scanning is transverse to a line of residue, where the scan goes beyond the actual line of the residue. A circular spot size having a sufficient width to cover the width of the residue would have a similar effect of providing higher energies in the middle of the scan line than adjacent thereto.

In the method, the substrate will likely at least partially reflect laser light. This reflection may be monitored and the irradiation of the laser may be terminated based on the reflectivity, in particular a change of reflectivity, which may indicate that no more or only negligible amounts of residue are present. The monitoring may thus provide an efficient endpoint detection for cleaning the substrate.

Furthermore, according to an aspect of an embodiment, an apparatus of cleaning a substrate having at least one surface having a residue to be removed thereon is provided. The apparatus comprises: a laser configured to scan at least an area of the surface having the residue thereon with laser light passing, thereby heating the surface and the residue; a controlling unit configured to control the heating so that a part of the residue first liquefies such that the liquefied part of the residue starts flowing towards the solid part of the residue, thereby forming a meniscus with the solid part of the residue and accumulating in part on top of the solid part, the thus generated thicker layer of residue absorbing further heat to be decomposed or vaporized. The apparatus shows the advantages set forth above with respect to the method.

According to another aspect, a computer program product that when running on a computer is capable of operating an associated apparatus to perform a method of cleaning a substrate having at least one surface having a residue to be removed thereon, the method comprising:

scanning at least an area of the surface having the residue thereon with laser light, thereby heating the surface and the residue;

controlling the heating so that a part of the residue first liquefies such that the liquefied part of the residue starts flowing towards the solid part of the residue, thereby forming a meniscus with the solid part of the residue and accumulating in part on top of the solid part, the thus generated thicker layer of residue absorbing further heat to be decomposed or vaporized.

BRIEF DESCRIPTION OF THE FIGURES OF THE DRAWINGS

FIGS. 5A-5C are diagrams illustrating an absorption rate for laser light of glues according to the first embodiment;

DETAILED DESCRIPTION

Figure 1:
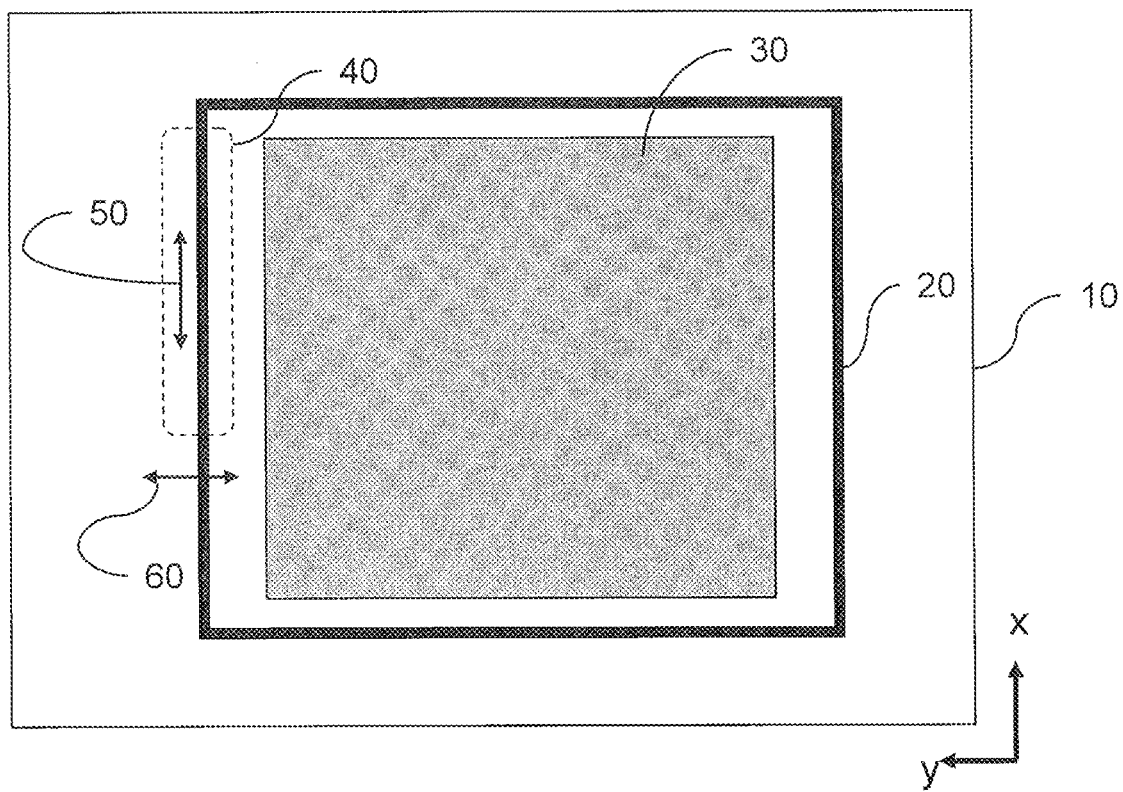
FIG. 1 is a diagram illustrating an exemplary plan view of a substrate according to a first embodiment.

Preferred embodiments of the present invention will be explained with reference to accompanying drawings. The present invention is not limited to these embodiments. The embodiments can be appropriately used in combination as long as the processes do not conflict with each other.

For purposes of illustration, embodiments of the invention will be described as applied to the cleaning of a photomask, and in particular to the removal of pellicle glue lines or glue pads from the photomask, although it will become apparent that they could also be applied to the cleaning of different substrates and for removal of different materials and particles. Such materials will be called solid when they are at a state in which they keep their physical shape for an extended period of time, even though their amorphous slate may allow the reader to regard them as high viscosity liquids. At that state, those materials have a viscosity well above 100000 cP (100 Pa·s), typically 250000 to 500000 cP (250 to 500 Pa·s). Such materials will be called liquefied in a state where the material starts flowing without external forces applied. In their liquefied state those materials have a viscosity below 100000 cP (100 Pa·s), typically 100 to 10000 cP (0.1 to 10 Pa·s). In the liquefied state, which is caused by heating, the viscosity but also the surface tension of those materials is lower where the temperature of the material is higher.

Directional phrases used herein, such as for example left, right, top, bottom, up, down, vertical horizontal and derivatives thereof, relate to the orientation of the elements shown in the drawings and are not limiting upon the claims unless expressly recited therein.

First Embodiment

FIG. 1 is a diagram illustrating an exemplary plan view of a substrate 10 according to the first embodiment. The substrate 10 has at least one surface having a residue 20 to be removed thereon. As shown in FIG. 1, the surface 10 having the residue 20 thereon has a central region 30, and the residue 20 is in a region of the surface radially outside the central region 30.

Specifically, the substrate 10 is a photomask and may be any one of a bare quartz substrate, a metal-coated substrate, and a mix of metal and quartz substrate. The residue 20 is a remaining adhesive residue or remaining glue, which is used to attach a pellicle to the photomask and which is left after removing the pellicle. The central region 30 is the pattern region of the photomask, as is known in the art to create a predetermined pattern while using the photomask during a photolithographic process. As indicated above, the method and apparatus as described herein may also be used for cleaning different types of substrates.

As can be seen in FIG. 1, the central region 30 has been described as being a rectangular shape, and the residue will typically be left behind along a line approximately parallel to one side of the central region 30.

For convenience of description, in the rest of the description, x and y axes are described as directions on a surface of the substrate 10, and z axis is described as a direction in the thickness direction of the substrate 10 (perpendicular to the surface of the substrate 10).

In the first embodiment, a longitudinal extension of the residue 20 is also called as a first direction, and a width direction (perpendicular to the longitudinal extension) of the residue 20 is also called as a second direction. As will be appreciated, the first and second directions are defined in relation to the extension of the residue (which changes it direction between the x axis and y axis directions) and not the substrate. With respect to the residue 20 in region 40 of the substrate 10, the double headed arrow 50 and the direction of the x axis of FIG. 1 correspond to the first direction, and an the double headed arrow 60 and the direction of y axis of FIG. 1 correspond to the second direction.

Figure 2:
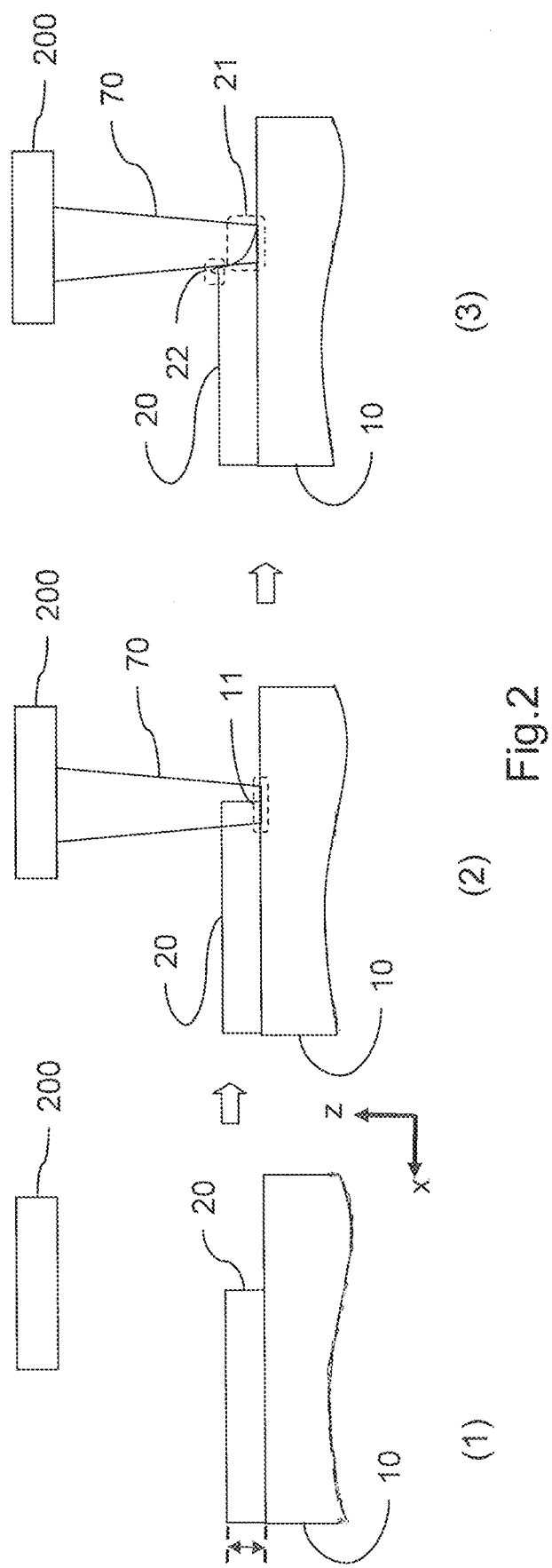
FIG. 2 is a conceptual diagram illustrating an example of steps involved in a method for cleaning a residue from a substrate according to the first embodiment.

FIG. 2 is a conceptual diagram illustrating an example of method steps for cleaning the residue 20 from the substrate 10 according to the first embodiment. As can be seen in step (1) of FIG. 2, the substrate 10 having residue 20 to be removed thereon is mounted with respect to an apparatus 200. The apparatus 200 is an apparatus configured for cleaning substrate 10 by means of laser radiation. Specifically, the apparatus 200 has a laser light source for irradiating a laser light beam 70 onto substrate 10 to clean the same as will be described herein below. The apparatus 200 also has a scanning device to scan the laser light over a target area of the substrate 10. Scanning may be provided at least by one of a movement of a laser light beam 70 over the substrate 10 and by movement of the substrate 10 with respect to the laser light beam 70.

After the substrate 10 is mounted with respect to apparatus 200, the laser light source generates a laser light beam 70 and directs the same onto an area 11 of the surface having the residue 20. Preferably, the light beam 70 is directed onto a region 11, which is at an edge of the residue 20, such that the laser beam 70. The laser beam 70 is scanned back and forth over the region 11, for example perpendicular to the plane of the FIG. 2, which is for example in the second direction, i.e. perpendicular to the longitudinal extension of the residue. At the same time, the substrate may be moved into the direction of the arrow as indicated in FIG. 2, such that the laser beam 70 also scans across the residue in the first direction, i.e. in the longitudinal extension thereof.

The laser beam 70 is selected to be of a suitable wavelength and intensity (which is locally inter alia related to the spot size and the scanning speed) such that the substrate and/or the residue itself absorb sufficient laser light to—in a first stage—heat the residue to a temperature above its melting temperature, if the residue is for example substantially transparent to the laser light, the same may be absorbed by the substrate which is heated and then heats the residue. In such a case the laser beam would be seen as indirectly heating the residue. The wavelength and the intensity is further selected to be of a suitable wavelength and intensity such that the substrate and/or the residue itself absorb sufficient laser light to—in a second stage—heat the previously molten residue to a temperature above its decomposition temperature.

When the residue is molten in the first stage, it forms a meniscus at the edge region caused by the thermal gradient between the molten portion and the solid portion, which pulls hot molten residue towards the cooler solid portion of the residue. This effect is known as a thermal Marangoni effect and ensures that the molten residue is pulled towards the solid portion. The molten residue is thus pulled to the left in FIG. 2 and forms the meniscus as shown in FIG. 2 step (3) where it is further heated by above its decomposition temperature during the second stage. The two stage process is thus defined by a sufficiently "slow" heating of the residue such that it is first molten, forms a meniscus in the molten state and is finally heated above its decomposition temperature to be decomposed and thus cleaned off of the substrate. The pulling force on the molten residue caused by the thermal Marangoni effect ensures that the residue is completely removed. During the cleaning, the laser beam is slowly moved in a direction towards the solid portion thereof, thereby defining a cleaning direction. At the same time the laser is typically scanned (back and forth movement) at a much faster scanning speed in a direction perpendicular to the cleaning direction.

As an example, the laser light employed in the first embodiment may be one generated by a $CO_2$ laser, or other lasers such as solid state lasers (DPSS) for example generating laser light having a wavelength between 0.3 µm (300 nm) and 2 µm (2000 nm). In a specific example, the apparatus proved to work well with a $CO_2$ laser generating laser light with a wavelength of approximately 10.6 µm (10600 nm), wherein the laser light was used to clean off a pellicle glue from a photomask.

In this example, the laser light had a wavelength at which the glue (residue 20) was almost transparent but the photomask (substrate 10) absorbed at least sufficient laser light to heat the substrate 10 and thereby the residue 20 in the above described two step manner. In contrast to the prior art in which laser light directly heated the residue to immediately decompose the same, the laser light of the above example heats the substrate 10. It is not necessary to heat the residue 20 directly by the laser light in this example and thus a laser having a shorter wavelength than is typically needed for direct heating of residue 20, may be used.

For example, when the substrate 10 is any one of a bare quartz substrate, a metal-coated substrate, and a mix of metal and quartz substrate, the laser light may be generated by a $CO_2$ laser having wavelength of approximately 10.6 µm (10600 nm).

Figure 3:
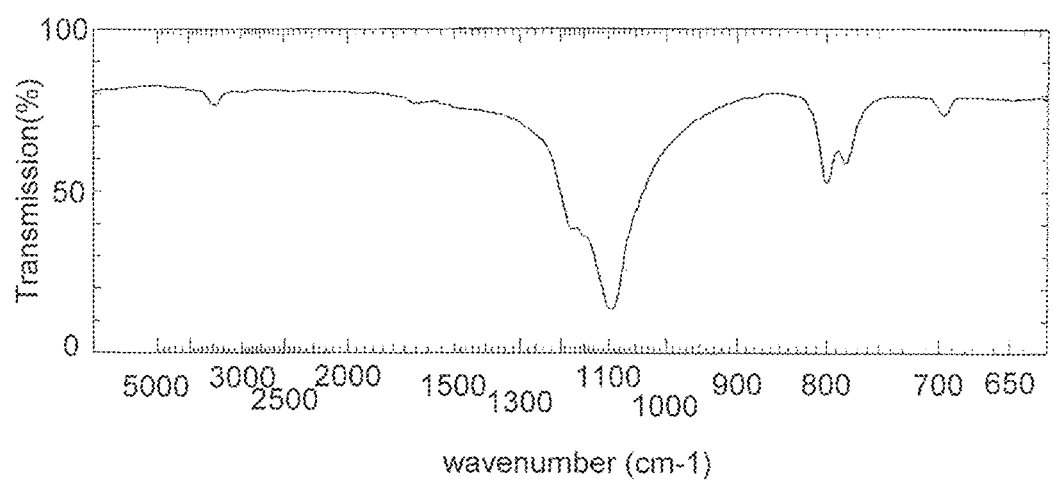
FIG. 3 is a diagram illustrating a transmission rate of laser light through a quartz substrate according to the first embodiment.
Figure 4:
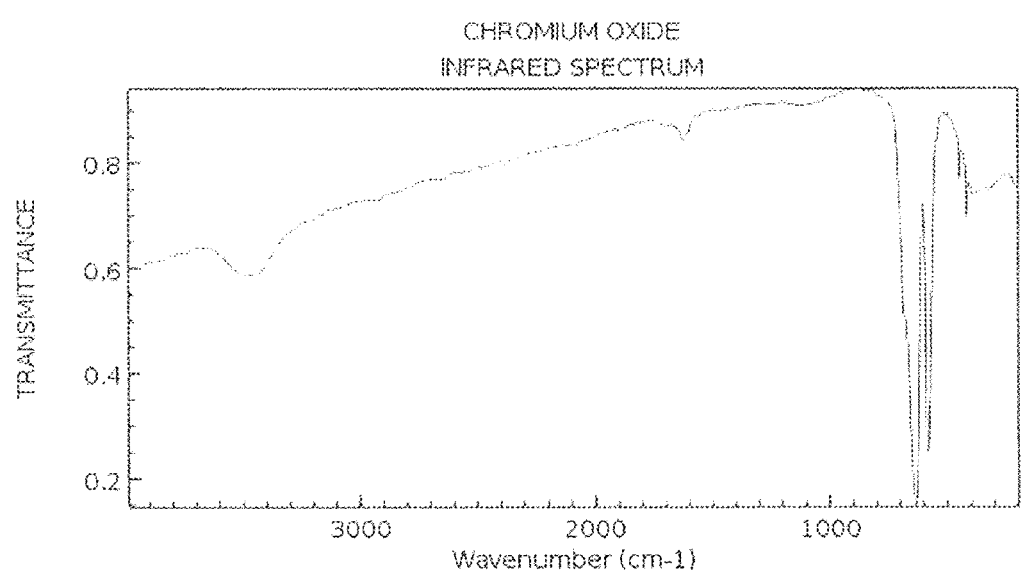
FIG. 4 is a diagram illustrating a transmission rate of laser light through a Chromium Oxide according to the first embodiment.

With reference to FIGS. 3-5C, an exemplary relationship between the substrate 10, the residue 20, and the laser light according to the above example will be described. FIG. 3 is a diagram illustrating a transmission rate of laser through a quartz substrate according to the above example. FIG. 4 is a diagram illustrating a transmission rate of laser through a Chromium Oxide according to the above example. FIGS. 5A-5C are diagrams illustrating an absorption rate of pellicle glues according to the above example. In FIGS. 3 and 4, the horizontal axis represents wavenumber (cm−1) and the vertical axis represents the transmittance (%). In FIGS. 5a-5c, the horizontal axis also represents wavenumber (cm−1) and the vertical axis represents the absorbance (%), which is, in other words, a value calculated by reducing the transmittance (%) from "1 (in other words, 100%)."

For example, when the wavelength of the laser light 70 is 10.6 µm, which corresponds to 934 cm−1, about 20% of the radiation is absorbed when the substrate is a quartz substrate as shown in FIG. 3. As shown in FIGS. 4 and 5A-5C, on the other hand, the amount of the laser light having a wavelength of 10.6 µm absorbed by either Chromium Oxide or the glue is almost 0%. As such, the laser light will only indirectly heat the glue via the substrate. Once the glue is molten, the absorption of the glue may change and may become higher, although this is not a requirement.

Taking the above example, the cleaning mechanism will again shortly recapped with reference to FIG. 2. The apparatus 200 controls the laser light beam and thus the heating so that the substrate is heated in the vicinity or beneath the residue 20 such that it liquefies and starts flowing towards the solid part of the residue, thereby forming meniscus (21, 22) with the solid part of the residue and accumulating in part on top of the solid part, the thus generated thicker layer of residue absorbing further heat, as shown in step (3) of FIG. 2. The thus liquefied residue 20 flows towards the solid part and continues to be heated above its decomposition temperature, and then decomposes. The residue may for example be liquefied at a temperature in the range of 200 to 300° C. and may decompose at temperatures in the range of 350 to 400° C. Obviously, these temperatures for liquefaction and decomposition are well below a melting temperature of the substrate to be cleaned.

Specifically, the apparatus 200 controls the heating at least in part by at least one of the following: a scanning speed of the scanning, a laser spot size of the laser light on the substrate 10, pulse frequency of the laser light, laser focus level, and energy of the laser light. The apparatus 200 may also control any one of focus position, scan pitch, and number of pass, and any combination thereof.

Some examples of parameters the apparatus 200 controls will be described briefly. The scanning speed of the scanning corresponds to the first speed, i.e. a speed with which the laser beam 70 is back and forth over an edge region of the residue 20. The scanning speed of the scanning is for example between 5 and 254 cm per second. Another parameter is the number of passes along the same scan line, which with a faster scan speed has to be higher than with a slow scan speed, if a certain power is to be delivered.

A second scanning speed which moves the scan front towards (a solid portion of) the residue is much slower and is for example 1 to 10 cm per second. The second scanning speed may also be defined by scan pitch, defining an incremental movement per back and forth scan or per multiple back and forth scans in a first scan direction.

The laser spot size of the laser light corresponds to the size of the diameter of the laser beam 70 on the substrate or the top surface of the residue. The laser spot size of the laser beam 70 is above 20 µm.

If a pulsed laser is used, the pulse frequency of the laser influences the power of the laser beam 70 and thus the respective heating provided thereby. The pulse frequency of the laser light may be between 1 and 20000 Hz.

The laser focus level again influences the intensity of the laser beam 70 and thus the respective heating provided thereby. The laser focus is preferably set to be between the surface of the substrate and 10 mm above the surface of the substrate.

As indicated above, the energy provided by the laser beam 70 has to be sufficient to heat the residue above its decomposition temperature in the two step process. It has been found that high energy lasers are not required and that for example an inexpensive 25 Watt laser may be used. In normal laser ablation, high power lasers are needed as typically instantaneous decomposition of the material to be ablated is desired. Preferably the laser has an energy rating of 200 Watts.

The apparatus 200 may also employs other parameters to adjust the heating, such as any one of Optical working distance, Focus Offset Flux reduction at end of scan. Exhaust volume to capture molten residue vapors, and any combination thereof. The optical working distance is a distance between the apparatus 200 and the residue 20. The optical working distance is between 0.1 and 100 cm. Preferably the optical distance is between 3 and 6 cm. The Focus Offset is related to the focus level and the laser spot size and thereby defines the energy per area which may be delivered. The Focus Offset is preferably between 0 and 10 mm. The flux reduction at end of scan is a specific technique designed by the Inventors, which reduces the energy flux of the laser beam 70 at the end of each scan line, i.e. before the scan direction is changed by 180°. This reduction is used to provide a more homogeneous energy transfer into the medium being heated. If the flux is not reduced, the end regions (of the scan) could otherwise receive too much energy during the time of reversal of the scan direction, which could lead to focal overheating, in particular when the ends of the scan lie outside of the area covered by the residue. In order to avoid such overheating, the flux reduction at the end of scan may be controlled to be well below the normal flux during the scan. Preferably, the flux may be reduced by 50%.

Figure 6:
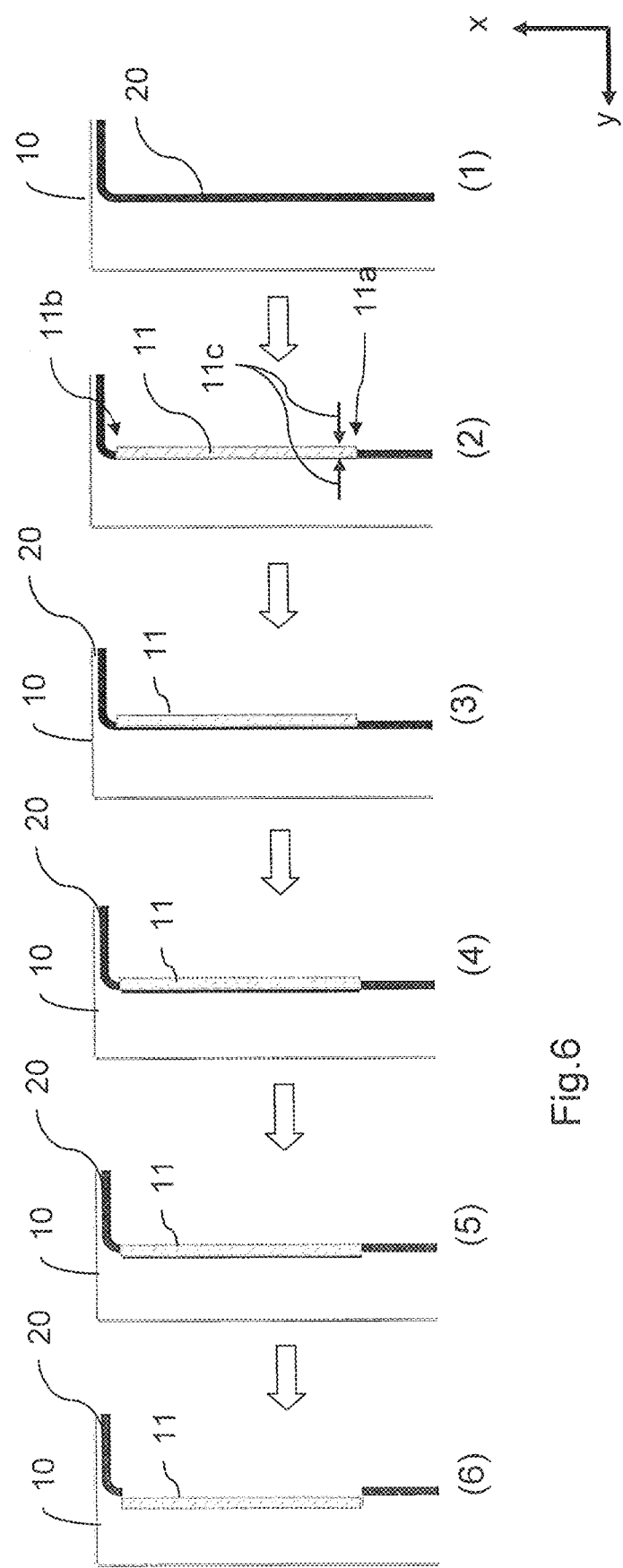
FIG. 6 is a diagram illustrating an example of exemplary steps involved in the method for cleaning a residue from a substrate according to the first embodiment.
Figure 7A:
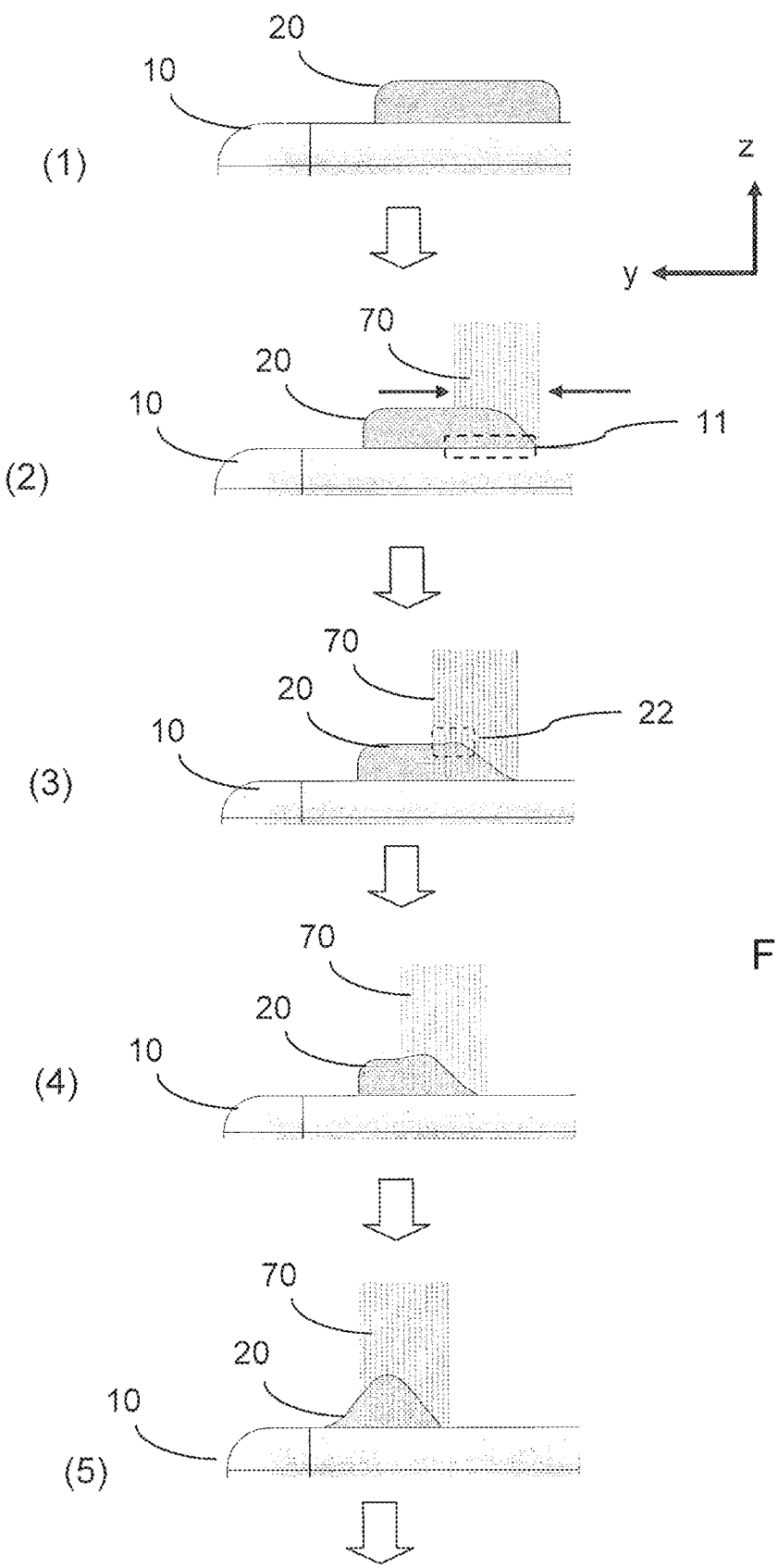
FIGS. 7A and 7B are cross sectional diagrams illustrating in more detail the sequence involved in removing a residue from a substrate according to the first embodiment.
Figure 7B:
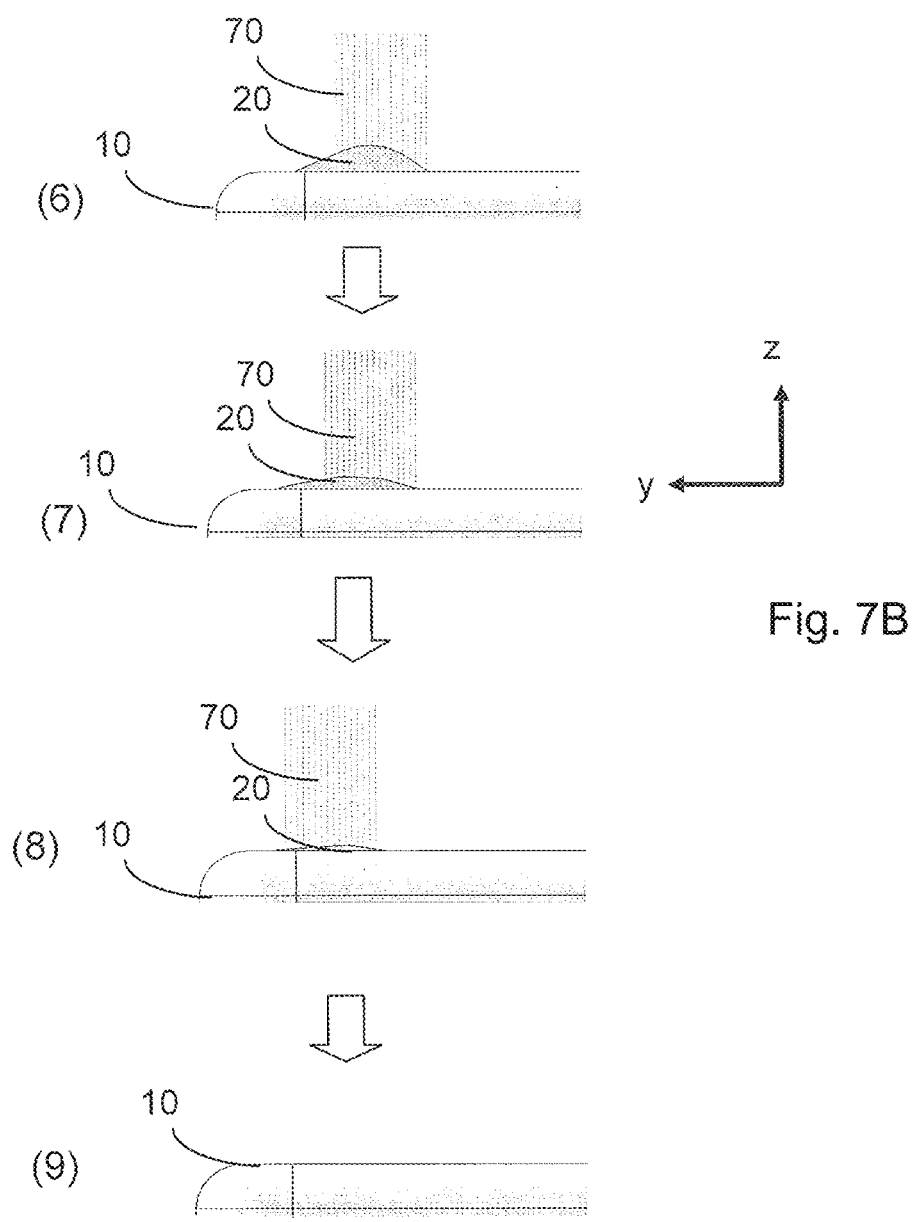
Figure 8:
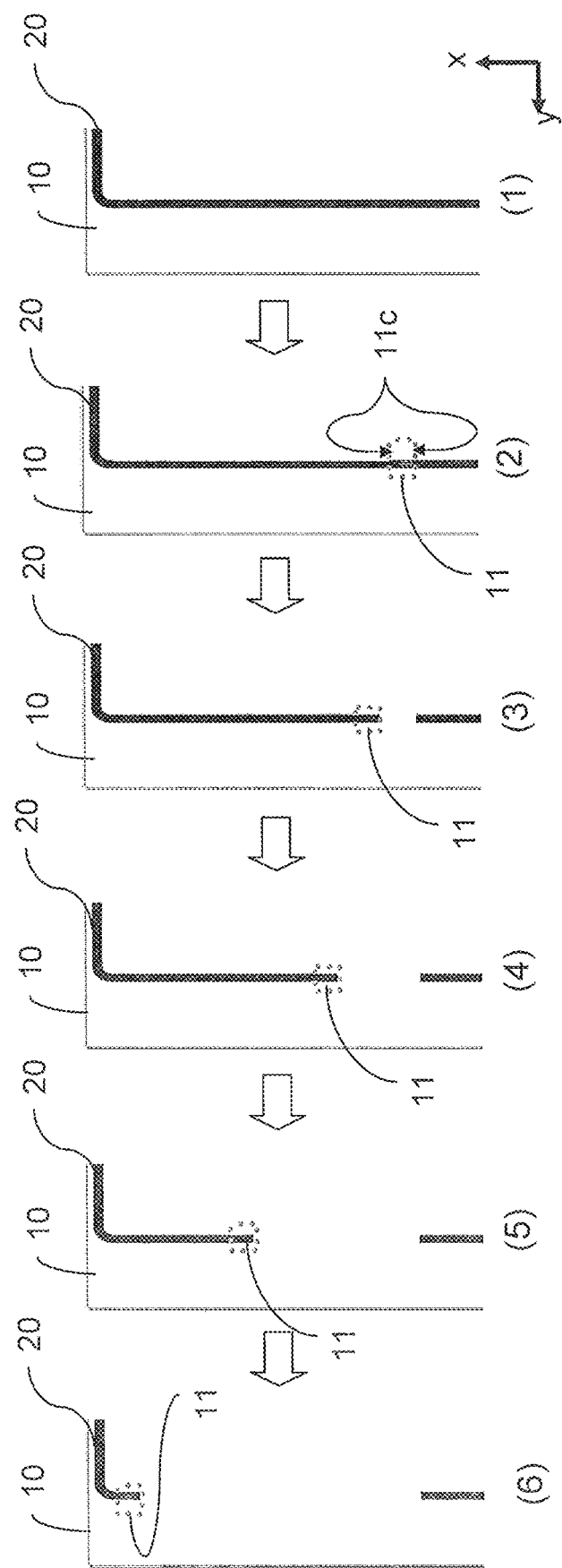
FIG. 8 is a diagram illustrating an example of exemplary steps involved in the method for cleaning a residue from a substrate according to other embodiment.

With reference to FIGS. 8, 7A, and 7B, an example of a process sequence of the method of cleaning the residue 20 from the substrate 10 will be described in more detail. FIG. 6 shows top views onto a substrate being cleaned at different times during a cleaning process where the cleaning direction (slow movement of the laser beam towards solid portion of residue once edge region is liquefied) is perpendicular to a longitudinal extension of the residue 20 on the substrate 10. FIGS. 7A and 7B shows cross sectional views through the substrate being cleaned at different times during the cleaning process.

As indicated by FIGS. 6 and 7A, in a first step (1) the apparatus 200 (not shown) and the substrate to be cleaned are aligned with each other, such that in a second step (2) a laser beam 70 generated by the apparatus 200 may be directed onto and scanned across an edge region of the residue 20 to clean the substrate 10. The scanning of the laser beam 70 includes moving the laser light 70 back and forth in a first direction repeatedly with a first scanning speed, while moving the laser light in a second direction (cleaning direction) which is perpendicular to the first direction with a second scanning speed. In the embodiment as shown, the first direction is parallel to a longitudinal extension of the residue while the second direction is perpendicular thereto. In particular, the second direction is inside out such that it moves from an inner edge of the residue 20—facing towards a centre of the substrate 10—towards and beyond an outer edge of the residue. The second direction is thus in a direction from a radially inner side of the residue 20 to the radially outer side of the residue 20 such that the meniscus moves away from the central region 30 of the substrate, which may for example be a pattern region of a photomask. The respective scanning speeds and other parameters of the laser beam are controlled to melt or liquefy the edge region of the first scanning speed is fast enough to form the meniscus at a scanned area of the surface 10, and faster than the second scanning speed. The second speed is slow enough for the meniscus to move forward in the second direction. In FIGS. 6 and 7, the first direction is a direction in the x-axis direction and the second direction is a direction in the y-axis direction.

As can be seen in second step (2) of FIGS. 6 and 7A, the apparatus 200 repeatedly scans the area 11 of the substrate 10 by moving the laser light 70 back and forth between two edges (11a, 11b) of the area 11. The laser parameters are controlled to cause heating and melting of the edge region of the residue to form a meniscus between a molten and a solid part thereof. In step (2) of FIG. 6, a distance between two arrows 11c corresponds to a width of the laser beam 70. As shown in steps (2)-(6) of FIG. 6 and steps (2)-(9) of FIGS. 7A and 7B, the apparatus 200 moves the scanned area slowly in the y-axis with a second scanning speed. The second speed is slow enough for the meniscus to form and move forward in the second direction, and to cause sufficient further heating of the residue to cause decomposition thereof. The thermal Marangoni effect pulls molten material upwards and towards the solid portion of the residue and may even form a small protrusion 22 of molten residue 20, which extends beyond the upper surface of the solid portion thereof, as can be seen in step (3) of FIG. 7A. The area of the substrate 10 behind the scanned area 11 becomes clean, i.e. any residue 20 is removed. As will be appreciated, when the scanned area 11 reaches the outer edge of the residue, the thermal Marangoni affect will no longer work as before, as the thermal gradient will be reduced as there is no solid portion remaining. The remaining residue, which is not yet decomposed nevertheless is pulled towards the outside of the substrate as it the substrate is cooler here. By further moving the scanned area 11 in the second direction (cleaning direction) all of the residue 20 will be finally sufficiently heated to be decomposed.

As explained with reference to FIGS. 6, 7A, and 7B, two relative movements between the laser beam 70 and the surface of the substrate 10 are employed. In the first direction the movement is a fast back-and forward scan. For example, the first speed may be 1 m/sec or any other suitable speed in view of the other laser parameters which allows the edge region of the residue to be liquefied and form the meniscus. In the second direction (which is shown to be perpendicular to the first direction in this embodiment), the movement is in the cleaning direction, i.e. in the direction of the pulling force caused by the thermal Marangoni effect causing the molten material to flow towards the solid (cooler) portion of the residue, thereby forming the meniscus. The second speed is chosen to be sufficiently slow for the effect to take place and to allow further heating of the molten material above its decomposition temperature. For example, the second speed is rather slow compared to the first scanning speed and may for example be in a range of a 1 to 10 cm per minute. The scanning movement in the first direction is preferably performed by movement of the laser beam (for example, by using a scanning mirror). The second movement can be performed by the apparatus 200, or also by for example movement of a scanning mirror, but could also be realized by moving the substrate 10. Other means may be provided to cause proper movement of a laser beam.

It is noted that the liquefied residue will move towards the not yet liquefied glue residue due to surface tension differentials between the liquefied and the solid portion of the meniscus (Marangoni effect). Hence, the meniscus moves forward at about the same rate as the secondary movement described above, building up and being further heated during the process to get decomposed or vaporized.

In the above examples, it was indicated that the residue is indirectly heated by the laser beam 70, as the residue 20 does not absorb substantial amounts of laser light. Rather, the laser light is at least partially absorbed by the substrate which is heated and thus heats the residue thereon. However, it should be realized, that is also possible that dependent on the material of the residue and the laser light chosen, that there residue absorbs more laser light, while the substrate 10 may be transparent or also absorbing laser light. As long as the energy transfer into the residue is appropriately controlled, the same process sequence can be maintained, i.e. edge region of residue is locally liquefied so that a meniscus is formed which moves forward as the scan area is moved forward (secondary movement) due to the Marangoni Effect (liquid media of lower surface tension (hotter molten material) moves towards liquid media of higher surface tension (cooler material)). The material is further heated and finally decomposes. This process is driven by local heating of the substrate surface/edge region of residue/meniscus irrespective where the laser light energy is actually absorbed.

As explained above, the embodiment enables a laser based cleaning process for the substrate, which uses the Marangoni effect to ensure that no material remains on the surface of the substrate. Low cost lasers may be used in this approach as contrary to normal ablation procedures direct and spontaneous decomposition of the target material to be cleaned off is not desired. The approach cleans the substrate 10 without the need of SPM-based chemistries, and as indicated may use a long-wave infrared laser. The approach employs direct and/or indirect heating to provide sufficient energy needed for the two step ablation process.

Other Embodiments

While the first embodiment has been described to explain the concept of the invention, the skilled person will realize various variations thereof with respect to the implementation. Some examples of such other implementations will be given herein below.

The components or the devices illustrated in the drawings need not necessarily be configured as illustrated in the drawings and as described above. For example, in the above embodiments, the substrate 10 was described to be a photomask made of a bare quartz substrate, a metal-coated substrate or a mix uncoated and metal coated quartz. The substrate 10, however, can be any other substrate of any suitable material, to which the cleaning method as explained can be applied. Furthermore, the residue was described as being a pellicle glue which is typically present on a photomask in a line shape as shown. Obviously, any other material, having different shapes on the substrate, which allows the two step approach of melting with the meniscus formation and subsequent decomposition may be cleaned off in this way. Nevertheless, the process is considered to be and proven to be particularly suitable for the pellicle glue application where a high cleanliness without the use of aggressive chemistry or high energies is desired.

While in the above embodiments, the laser beam 70 has been irradiated onto the side of the substrate 10 having the residue 20 thereon (front side), if the substrate is substantially transparent and or sufficiently thin, also a back side irradiation may be contemplated. Again, however, the initial concept of a front side irradiation is considered to be particularly beneficial as it allows best to provide a localized heating to achieve the desired effect without too much heat loss in the bulk material of the substrate. Nevertheless, depending on the application, the method may use back side irradiation such that that a part of residue 20 (on the front side) first liquefies such that the liquefied part of the residue starts flowing towards the solid part of the residue, thereby forming the meniscus with the solid part of the residue and accumulating in part on top of the solid part, the thus generated thicker layer of residue absorbing further heat to be decomposed or vaporized.

In the above embodiments, the substrate 10 has been explained as having the central region 30, and the residue 20 being present in a region on the surface radially outside the central region 30; however, the substrate obviously is not limited in this respect. For example, the substrate 10 may not have the central region 30 or the residue may also be or solely be present in such a central region 30. In the above embodiments, the shape of the central region 30 has been described as rectangular and the shape of the residue 20 is linear, but these shapes are not limited as described in FIG. 1. The shape of the central region 30 and the shape of the residue 20 may be any shape. For example, the central region 30 may be rectangular shape, triangle shape, circle shape, or any other possible shape. The residue 20 may be broken line shape, simply a single or a plurality of dot or any other possible shape.

In the above embodiments, the second direction has been described as perpendicular to the first direction, however, is not limited to this. For example, the second direction may a direction which is not perpendicular to the first direction, but may be a predetermined angle with respect to the first direction. Also, rather than scanning back and forth in a first direction, the laser beam may for example also be of a width such that no scanning is required in the first direction and a movement in the second direction is sufficient. This may for example be the case where the residue is line shaped and the laser spot is wider than the width of the line. In this case movement in only the cleaning direction would suffice. Also a back and forth scanning along the line such that a movement component in the direction of the line is achieved could work. In the cleaning example described with respect to FIGS. 6, 7A, and 7B the scanning means scanned the laser beam 70 back and forth in a longitudinal extension of the residue (glue line) to melt the inner edge region thereof and so that the molten residue 20 (or the meniscus) moved perpendicular thereto towards the outside of the substrate in the second direction. But as indicated above, other movements are obviously possible.

FIG. 8 shows an example of such other movements, wherein FIG. 8 shows top views onto a substrate being cleaned at different times during a cleaning process similar to FIG. 6. At this time, the cleaning direction (slow movement of the laser beam towards solid portion of residue once part of the residue is liquefied) is along the longitudinal extension of the residue 20 on the substrate 10 and the faster back and forth scanning movement is in the width direction of the residue line. As can be seen in FIG. 8, the apparatus 200 (not shown) is again first aligned with the residue line. When the apparatus generates the laser beam 70, it generates an irradiated area 11 on the substrate. The laser beam 70 again causes melting of the residue and the formation of a meniscus in the irradiated area 11. As the molten part is in the middle of the residue line, actually two menisci may initially be formed. By moving the irradiated area 11, along the residue line to the left in FIG. 8, the meniscus on the right side of the irradiated area will eventually solidify. The meniscus one the left side will be moved with the irradiated area 11, and the cycle of melting, meniscus formation, decomposition as explained above will proceed along the residue line.

The apparatus 200 may generate the irradiated area 11 on the substrate 10—as can be seen in FIG. 8 step (2)—by moving the laser light 70 back and forth along a first direction in the width direction of the residue 20. The laser beam 70 may be scanned such that the endpoints of the scan are just beyond the side edges of the residue line. In FIG. 8 step (2), a distance between two arrows 11c corresponds to a width of the laser beam 70. It should be noted that the width is only shown schematically and it may be much smaller than indicated by the drawing. As shown in FIG. 8 steps (2)-(6), the irradiated area 11 is then moved along the longitudinal extension of the residue 20, with a speed controlled to allow the process sequence as described above.

In the above embodiment, the scanning has been explained as again including two movements, one in the width direction of the residue line one along the same. However, the scanning is not limited to this. For example, the spot size of the laser beam 70 may be adjusted such that no scanning is required to provide irradiation in the area 11 indicated in FIG. 8 (2). The scanning of the laser beam 70 may then include only moving forward in the cleaning direction with a speed which is slow enough for the process sequence of melting, meniscus formation and decomposition to take place. In other words, the scanning of the laser beam 70 may not include moving the laser beam 70 back and forth in the first direction. For example, when the laser beam 70 has a width which is enough to cover a range of interest to be cleaned, the scanning may omit moving the laser beam 70 back and forth in the first direction and may only move the laser beam 70 in one direction. With reference to the example in FIG. 8, when the laser beam 70 has a spot size wider than the width of the residue 20, the scanning be only along the residue line.

Furthermore, the apparatus 200 may control the energy of the laser light 70 by reducing the energy towards the ends of each scan pass in the first direction. This may prevent overheating at the end of each scan, especially when scanning is transverse to a line of the residue 20 as in the above example. A circular spot size having a sufficient width to cover the width of the residue would have a similar effect of providing higher energies in the middle of the scan line than adjacent thereto.

When the substrate 10 at least partially reflects the irradiation of the laser beam 70, the cleaning method may include monitoring reflection of the laser beam 70 which will change dependent on remaining residue in the irradiated area. The cleaning process may then be terminated based on monitoring the reflection.

Depending on the substrate being cleaned, it may be preferred to perform the cleaning method under a blanket of inert gas, such as nitrogen to avoid oxidation of the surface.

Furthermore, the parameters of the laser beam may be controlled such that the surface temperature of the substrate 10 keeps below a threshold level to avoid an impact on the physical or optical properties of the substrate. In particular, the parameters may be controlled so that the surface temperature of the substrate 10 for example does not exceed 500 C. The surface temperature may be measured during the process or the process is controlled in accordance with an appropriate recipe. If substantial deviations from the recipe are detected such as the scanning not being performed properly, such that the laser beam is for example stationary or not moving along the cleaning direction as desired, the laser may be switched off or diverted to avoid overheating of the substrate.

Furthermore, the method of cleaning a substrate may also be implemented by having the functions performed by apparatus 200 to be controlled by a known information processing apparatus, i.e., a computer. The known information processing apparatus may be any information apparatus which is connected and able to control a laser irradiation apparatus. The computer may include a storage configured to store therein various programs having the same functions to implement the method of cleaning a substrate as explained above. The computer may include a CPU configured to read the various programs from the storage and to execute the program to control the associated equipment to clean the substrate.

The various programs may not always be stored in the computer itself, but may be stored in a computer readable recording medium, such as a CD-ROM, a DVD disk, or a USB memory, a semiconductor memory, such as a flash memory, a hard disk drive or other medium. Furthermore, The various programs may also be stored in a device connected to the apparatus for example via a network such as the Internet, a local area network (LAN), a wide area network (WAN), or the like and the computer may also read and execute the programs from the recording medium described above.

What is claimed is:

1. A method for cleaning a substrate having at least one surface having a residue to be removed thereon, the method comprising:
    scanning at least an area of the surface having the residue thereon with laser light to thereby heat the surface and the residue;
    controlling the heating so that a part of the residue first liquefies such that the liquefied part of the residue starts flowing towards the solid part of the residue, thereby forming a meniscus with the solid part of the residue and accumulating in part on top of the solid part, the thus generated thicker layer of residue absorbing further heat to be decomposed or vaporized;
    wherein the scanning of the laser light comprises moving the laser light back and forth in a first direction repeatedly with a first scanning speed, while moving the laser light in a second direction which is perpendicular to the first direction with a second scanning speed,
    wherein the first scanning speed is fast enough to form the meniscus at a scanned area of the surface, and faster than the second scanning speed, and
    wherein the second speed is slow enough for the meniscus to move forward in the second direction.

2. The method according to claim 1, wherein the heating is controlled at least in part by at least one of the following: a scanning speed, a laser spot size of the laser light on the substrate, pulse frequency of the laser light, laser focus level, and energy of the laser light.

3. The method according to claim 1, wherein
the surface of the substrate which has the residue thereon has a central region, and the residue is in a region of the surface radially outside the central region, and
the second direction is in a direction from a radially inner side of the residue to the radially outer side of the residue such that the meniscus moves away from the central region.

4. The method according to claim 1, wherein
the surface of the substrate which has the residue thereon has a central region,
the central region has a rectangular shape,
the residue has a line shape approximately parallel to one side of the central region,
the first direction is a longitudinal direction of the residue, and
the second direction is a width direction of the residue.

5. The method according to claim 1, wherein
the surface of the substrate which has the residue thereon has a central region,
the central region has a rectangular shape,
the residue is located outside the central region, and
the second direction is directed away from the central region towards an edge of the substrate.

6. The method according to claim 1, wherein the laser light has a wavelength between 5 and 25 µm.

7. The method according to claim 1, wherein
the laser light is a $CO_2$ laser with wavelength of approximately 10.6 µm, and
the substrate is any one of a bare quartz substrate, a metal-coated substrate, and a mix of metal and quartz substrate.

8. The method according to claim 1, wherein the energy of the laser light is reduced towards the ends of each scan pass in the first direction.

9. The method according to claim 1, wherein
the substrate at least partially reflects the irradiation of the laser light, the method further comprising:
monitoring a reflectivity of the laser light from the substrate; and
terminating the irradiation of the laser light based on the reflectivity.

10. An apparatus for cleaning a substrate having at least one surface having a residue to be removed thereon, the apparatus comprising:
a laser configured to scan at least an area of the surface having the residue thereon with laser light passing, thereby heating the surface and the residue;
a controlling unit configured to control the heating so that a part of the residue first liquefies such that the liquefied part of the residue starts flowing towards the solid part of the residue, thereby forming a meniscus with the solid part of the residue and accumulating in part on top of the solid part, the thus generated thicker layer of residue absorbing further heat to be decomposed or vaporized;
wherein the controlling unit is configured to cause the scanning of the laser light to move the laser light back and forth in a first direction repeatedly with a first scanning speed, while moving the laser light in a second direction which is perpendicular to the first direction with a second scanning speed,
wherein the first scanning speed is fast enough to form the meniscus at a scanned area of the surface, and faster than the second scanning speed, and
wherein the second speed is slow enough for the meniscus to move forward in the second direction.

11. A computer program product comprising a non-transitory computer readable medium having instructions recorded thereon, the instructions executed by a controller configured to cause a cleaning apparatus to perform the method of cleaning a substrate as set forth in claim 1.

12. The method according to claim 1, wherein the substrate is a photomask and the residue is an adhesive or a pellicle glue.

* * * * *